United States Patent
Isobayashi (10) Patent No.: US 10,031,414 B2
(45) Date of Patent: Jul. 24, 2018

(54) TEMPLATE, METHOD OF MANUFACTURING THE SAME, AND IMPRINT METHOD

(71) Applicant: Toshiba Memory Corporation, Minato-ku, Tokyo (JP)

(72) Inventor: Atsunobu Isobayashi, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 527 days.

(21) Appl. No.: 14/476,485

(22) Filed: Sep. 3, 2014

(65) Prior Publication Data

US 2015/0360412 A1    Dec. 17, 2015

(30) Foreign Application Priority Data

Jun. 13, 2014 (JP) ................. 2014-122806

(51) Int. Cl.
  *B29C 59/02* (2006.01)
  *G03F 7/00* (2006.01)

(52) U.S. Cl.
  CPC ................. *G03F 7/0002* (2013.01)

(58) Field of Classification Search
  CPC ................. B82Y 40/00; G03F 7/0002
  See application file for complete search history.

(56) References Cited

U.S. PATENT DOCUMENTS

| | | | |
|---|---|---|---|
| 8,187,797 B2 | 5/2012 | Shiobara et al. | |
| 2009/0148619 A1* | 6/2009 | LaBrake | B82Y 10/00 427/511 |
| 2010/0104984 A1* | 4/2010 | Shiobara | B82Y 10/00 430/319 |
| 2010/0187714 A1* | 7/2010 | Kobiki | B82Y 10/00 264/135 |
| 2011/0315077 A1 | 12/2011 | Asano | |

FOREIGN PATENT DOCUMENTS

| | | |
|---|---|---|
| JP | 2010103415 A | 5/2010 |
| JP | 2010171338 A | 8/2010 |
| JP | 2012121213 A | 6/2012 |
| JP | 2013254913 A | 12/2013 |
| JP | 5426489 B2 | 2/2014 |

OTHER PUBLICATIONS

Vieu et al., "Electron beam lithography: resolution limits and applications", Applied Surface Science 164, (2000), p. 111-117.*

* cited by examiner

*Primary Examiner* — Galen H Hauth
(74) *Attorney, Agent, or Firm* — Holtz, Holtz & Volek PC (57) ABSTRACT

According to one embodiment, there is provided a template including a first pattern, a second pattern, and a first dummy pattern. A concave-convex pattern having the width equal to 100 nm or less is arranged in the first pattern. A concave-convex pattern having the width wider than 100 nm is arranged in the second pattern. The first dummy pattern is arranged at the bottom of a concave pattern of the second pattern and made shorter than the concave-convex pattern. The first dummy pattern is arranged adjacently to another pattern at an interval equal to 100 nm or less.

10 Claims, 8 Drawing Sheets

TEMPLATE, METHOD OF MANUFACTURING THE SAME, AND IMPRINT METHOD

CROSS-REFERENCE TO RELATED APPLICATIONS

This application is based upon and claims the benefit of priority from Japanese Patent Application No. 2014-122806, filed on Jun. 13, 2014; the entire contents of which are incorporated herein by reference.

FIELD

Embodiments described herein relate generally to a template, a method of manufacturing a template, and an imprint method.

BACKGROUND

Nanoimprint lithography is a technology of pressing a template, in which a concave-convex pattern is formed, against a device substrate above which a resist is dropped, curing the resist, and forming a resist pattern having a concave and convex pattern reversed from that in the template. The aforementioned processing in the nanoimprint lithography is repeated one shot at a time in order. Therefore, it takes time to drop the resist above the device substrate, move the template, press the template, and cure the resist, requiring more time in the processing than photolithography performed in the related art.

A capillary phenomenon is used to fill the concave-convex pattern of the template with the resist. Although a concave pattern in a fine concave-convex pattern can thus be filled with the resist in a relatively short time, a concave pattern in a large concave-convex pattern having the width wider than 100 nm requires more time to be filled with the resist. The large concave-convex pattern is incompletely filled with the resist when the template is pressed for a shorter period of time in order to increase throughput. Conversely, when one attempts to fill the large concave-convex pattern with the resist completely, the template is pressed for a longer period of time, causing the throughput to be decreased.

DETAILED DESCRIPTION

In general, according to one embodiment, there is provided a template having a first pattern, a second pattern, and a first dummy pattern. A concave-convex pattern having the width equal to 100 nm or less is arranged in the first pattern. A concave-convex pattern having the width wider than 100 nm is arranged in the second pattern. The first dummy pattern is arranged at a bottom of a concave pattern of the second pattern and is shorter than the height of the concave-convex pattern. The first dummy pattern is also arranged such that the first dummy pattern and another pattern adjacent thereto are arranged at an interval of 100 nm or less.

Exemplary embodiments of a template, a method of manufacturing a template, and an imprint method will be explained below in detail with reference to the accompanying drawings. The present invention is not limited to the following embodiments. Moreover, the cross-sectional view of the template in the following embodiments is used as a schematic representation and may differ in a relationship between the thickness and the width of a layer and a ratio of the thickness of each layer from an actual one. The film thickness below is illustrated as an example and is not limited thereto.

Figure 1A:
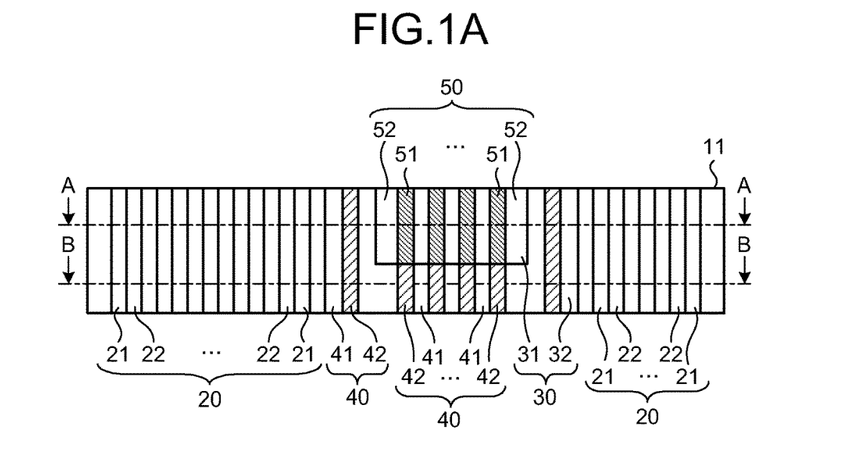
FIGS. 1A to 1C are diagrams illustrating an example of a structure of a template according to an embodiment.
Figure 1B:
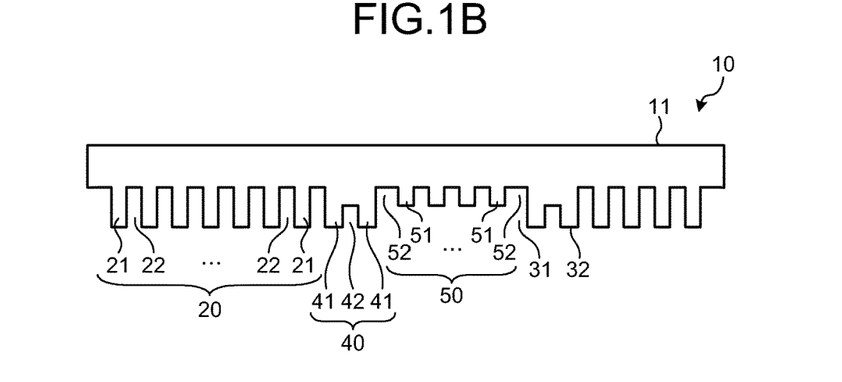
Figure 1C:
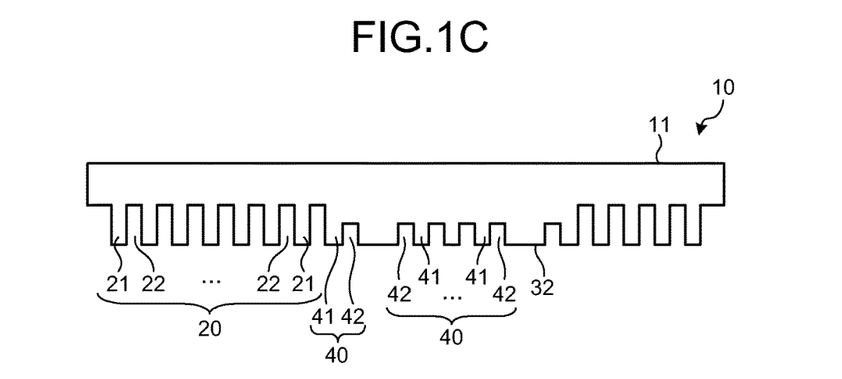

FIGS. 1A to 1C are diagrams illustrating an example of a structure of a template according to an embodiment where FIG. 1A is a bottom view, FIG. 1B is a cross-sectional view taken along line A-A in FIG. 1A, and FIG. 1C is a cross-sectional view taken along line B-B in FIG. 1A.

A template 10 is formed by forming a concave-convex pattern on one surface (bottom surface) of a template substrate 11 made of glass, silicon, or resin. The concave-convex pattern includes a fine pattern having the width equal to 100 nm or less and a large pattern having the width wider than 100 nm. An example of the fine pattern is a line-and-space pattern 20 in which a line pattern 21 and a space pattern 22 each having the width between 10 and 50 nm are arranged in a direction intersecting a direction in which the line and space patterns extend. The large pattern includes a peripheral pattern 30 including a concave pattern 31 and a convex pattern 32, each of which has the width wider than 100 nm. Concave and convex patterns in these line-and-space pattern 20 and peripheral pattern 30 are reversed from that in a resist pattern formed above a substrate by using the template 10.

A dummy pattern 50 is provided in an area on the template 10 where the width of the concave pattern 31 is wider than 100 nm. A capillary phenomenon does not occur readily when a distance between patterns exceeds 100 nm, in which case it takes more time to fill the pattern with a resist. Accordingly, the present embodiment is provided with a concave-convex pattern, in which the distance between the concave pattern 31 having the width wider than 100 nm and a pattern adjacent thereto equals 100 nm or less, in order to cut the time it takes for the pattern to be filled with the resist by the capillary phenomenon. There is used, as the dummy pattern 50, a line-and-space pattern in which a line pattern 51 and a space pattern 52 each having the same width as the line-and-space pattern 20 are arranged in a direction intersecting a direction in which the line and space patterns extend, for example.

Furthermore, a dummy pattern 40 is provided in an area on the template 10 where the width of the convex pattern 32 is wider than 100 nm. The convex pattern 32 corresponds to an area where a pattern is not formed on a substrate to be processed. The dummy pattern 40 is provided on the convex pattern 32 so that, when there exists a concave pattern having the width wider than 100 nm in a direction in which the dummy pattern 40 extends, for example, the resist can be supplied to the concave pattern in a short time. There is used, as the dummy pattern 40, a line-and-space pattern 20 in which a line pattern 41 and a space pattern 42 each having the same width as the line-and-space pattern 20 are arranged in a direction intersecting a direction in which the line and space patterns extend, for example.

These dummy patterns 40 and 50 provided on the template 10 are not transferred to the substrate when the substrate is etched with the resist pattern that is formed by transferring the template 10 thereto. The height of the dummy patterns 40 and 50 may thus be shorter than the height of a regular concave-convex pattern (the line pattern 21 and the convex pattern 32). When the dummy pattern 50 is provided to the concave pattern 31, the dummy pattern 50 is projected from the bottom of the concave pattern 31 and made shorter than the height of the convex pattern 32. When the dummy pattern 50 is provided to the convex pattern 32, the dummy pattern 40 is provided such that a bottom surface of the convex pattern 32 and a bottom surface of the line pattern 41 are at the same height. That is, the line-and-space dummy pattern 40 is provided by carving the space pattern 42 on the bottom surface of the convex pattern 32. The depth of the space pattern 42 at this time is less than the height of the convex pattern 32.

The dummy patterns 40 and 50 are desirably configured by a pattern having the same width as the line pattern 21 and the space pattern 22 in the line-and-space pattern 20. It is further desired that an aspect ratio (pattern height/line width) of each of the dummy patterns 40 and 50 be smaller, by 1 or more, than an aspect ratio of the line pattern 21 or the space pattern 22 in the line-and-space pattern 20. Where the aspect ratio of the line pattern 21 or the space pattern 22 in the line-and-space pattern 20 equals 2 or higher, the aspect ratio of the dummy patterns 40 and 50 equals 1 or lower, for example. This allows one to distinguish a pattern which is manufactured by the same process to have the same height but used to process an object to be processed having variation, from a pattern, the height of which is intentionally changed to serve as the dummy pattern as described above. In other words, one can distinguish the pattern transferred to the object to be processed from the pattern not transferred thereto. One can thus prevent the dummy patterns 40 and 50 from being transferred to the object to be processed by varying the aspect ratio between the pattern to be formed on the object to be processed and the dummy patterns 40 and 50 by 1 or more.

Figure 2A:
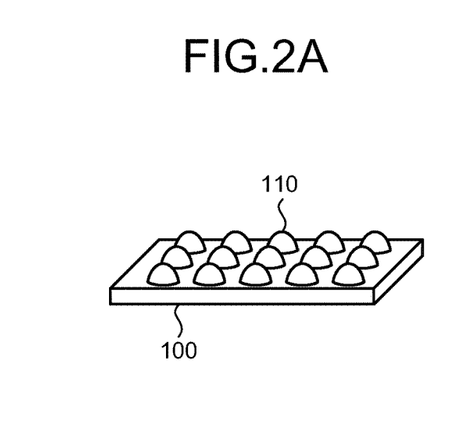
FIGS. 2A to 2E are diagrams schematically illustrating an example of steps performed in an imprint method according to an embodiment.

Now, there will be described an imprint method using such template. FIGS. 2A to 2E are diagrams schematically illustrating an example of steps performed in the imprint method according to an embodiment. First, as illustrated in FIG. 2A, a resist 110 is dropped by an ink jet method onto a shot area of a substrate 100 above which a device is fabricated. A film to be processed such as a conductive film or an insulating film may be formed above the substrate 100. A UV curable resin or the like can be used as the resist 110.

The resist 110 has a diameter between 10 and 100 μm and is dropped at an interval of 50 to 500 μm, for example.

Figure 2B:
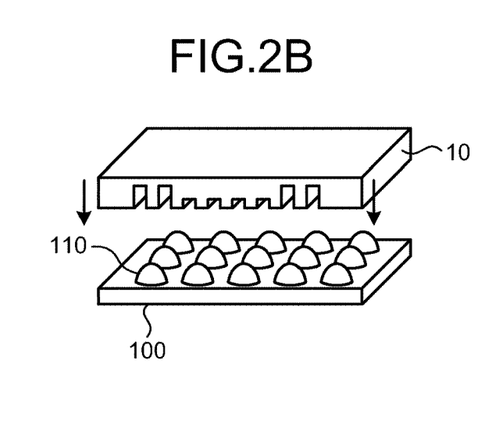
Figure 2C:
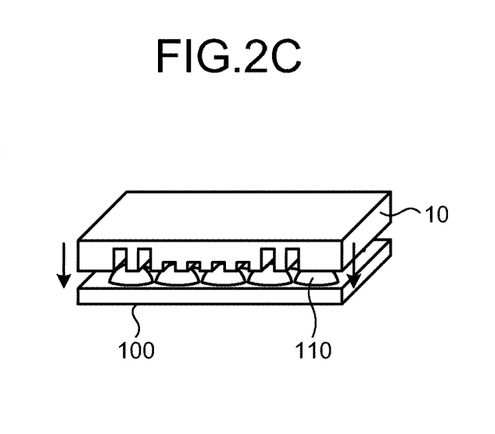

Next, as illustrated in FIG. 2B, the template 10 is moved to the shot area, onto which the resist 110 is dropped, while a pattern-formed surface (bottom surface) of the template 10 faces the substrate 100. At this time, the position of the template 10 is aligned with the position of the substrate 100. The template 10 is thereafter brought into contact with the substrate 100 through the resist 110, as illustrated in FIG. 2C.

As illustrated in FIG. 2A, the resist 110 is sparsely arranged on the shot area. The template 10 is arranged on the substrate 100 while keeping a predetermined distance therefrom, as illustrated in FIG. 2C. The concave-convex pattern being formed in the template 10, the resist 110 starts to fill up the concave pattern of the template 10, from a site where the template 10 is brought into contact with the resist 110, along a direction in which the concave pattern extends.

Figure 3A:
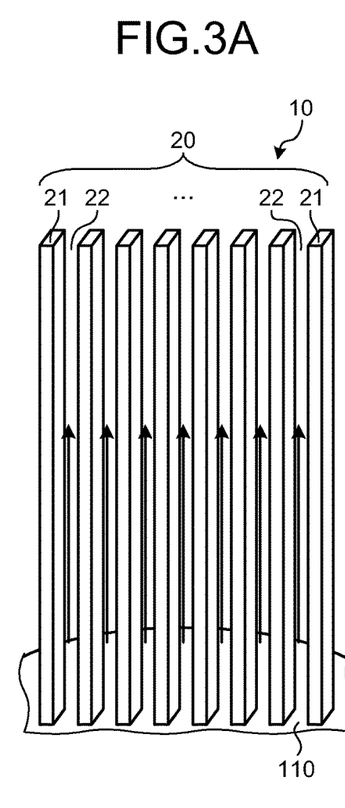
FIGS. 3A and 3B are top views schematically illustrating a state of a resist when the template is brought into contact with a substrate.
Figure 3B:
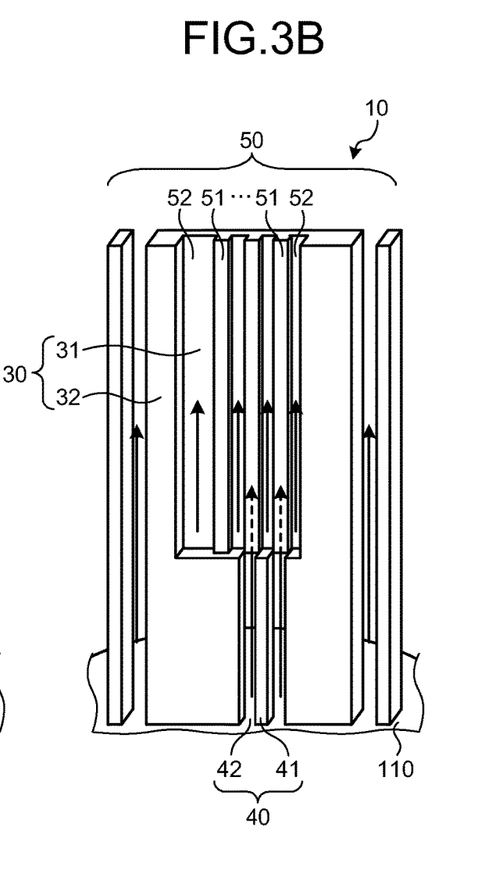

FIGS. 3A and 3B are top views schematically illustrating a state of the resist when the template is brought into contact with the substrate. As illustrated in FIG. 3A, the space pattern 22 (concave pattern) of the template 10 starts to be filled with the resist 110 in a direction parallel to the surface of the substrate by the capillary phenomenon at a site where the line-and-space pattern 20 with a half pitch equal to 100 nm or less is formed. Moreover, as illustrated in FIG. 3B, the dummy patterns 40 and 50 with a half pitch equal to 100 nm or less are also formed in the concave pattern 31 or the convex pattern 32 of the peripheral pattern 30 having the width equal to 100 nm or wider, as described above. The space patterns 42 and 52 therefore start to be filled with the resist 110, from a site where the template 10 is brought into contact with the resist 110, along a direction in which the dummy patterns 40 and 50 extend by the capillary phenomenon as is the case with the line-and-space pattern 20. As a result, the resist 110 is quickly supplied to the peripheral pattern 30 (concave pattern 31).

The bottom surface of the dummy pattern 50 (line pattern 51) of the peripheral pattern 30 (concave pattern 31) is not in contact with the top surface of the substrate 100. However, the concave-convex pattern formed in the template 10 is extremely small compared to the size of the resist 110 so that, when the template 10 is brought into contact with the substrate 100, the dummy pattern 50 formed in the peripheral pattern 30 (concave pattern 31) comes into contact with the resist 110. As a result, the peripheral pattern 30 (concave pattern 31) is also filled with the resist 110 through the dummy pattern 50 (space pattern 52) formed at the bottom of the peripheral pattern 30 (concave pattern 31).

Note that the dummy pattern 40 formed on the convex pattern 32 illustrated in FIG. 1C plays a role as a path to supply the resist 110 to a concave pattern when such concave pattern is arranged at an end of the dummy pattern 40 in the direction in which the dummy pattern extends.

Figure 2D:
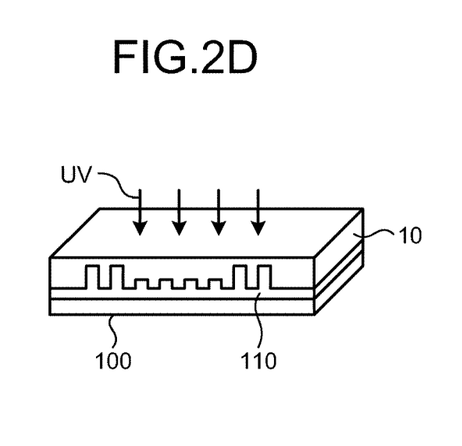
Figure 2E:
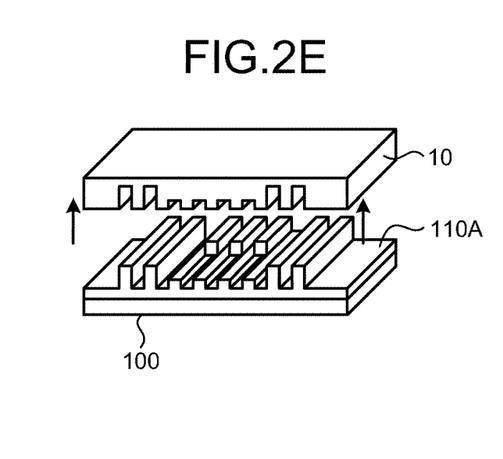

Next, as illustrated in FIG. 2D, the resist 110 is irradiated with ultraviolet rays through the template 10 to solidify the resist 110. The template 10 is thereafter released to form a resist pattern 110A having a concave-convex pattern reversed from the concave-convex pattern of the template 10, as illustrated in FIG. 2E. The resist pattern 110A is used as a mask to process the substrate (film to be processed).

Note that the aforementioned example describes a case where a UV curable resin is used as the resist 110 so that the resist 110 is solidified by the irradiation of the ultraviolet rays. However, a thermosetting resin may be used as the resist 110, which is solidified by heat.

Figure 4A:
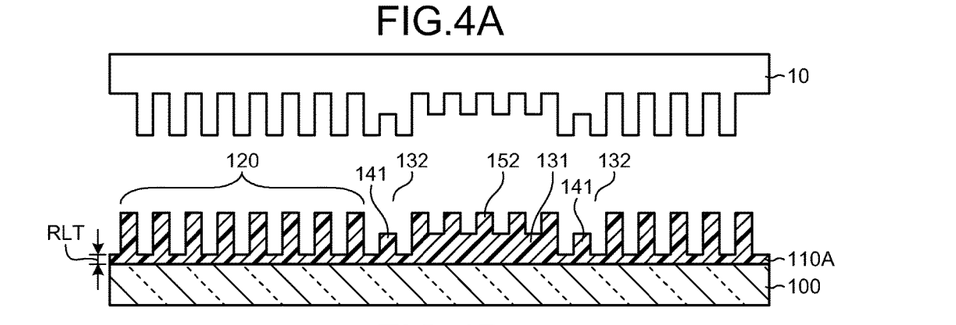
FIGS. 4A to 4C are cross-sectional views schematically illustrating an example of a pattern forming method according to an embodiment.
Figure 4B:
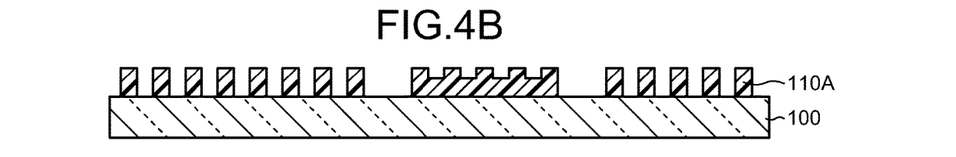
Figure 4C:
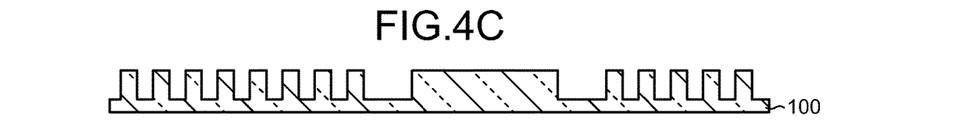
Figure 5A:
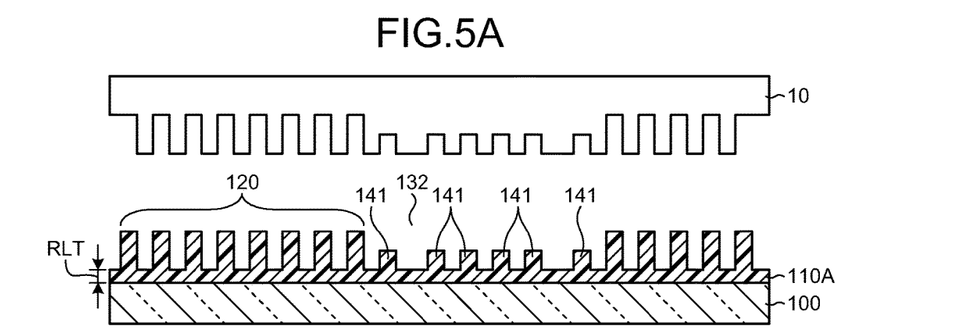
FIGS. 5A to 5C are cross-sectional views schematically illustrating an example of the pattern forming method according to an embodiment.
Figure 5B:
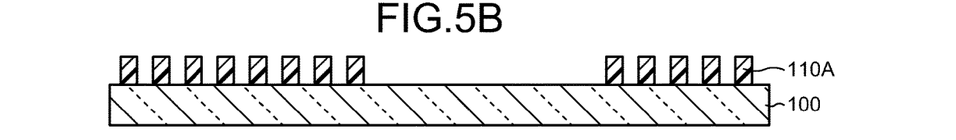
Figure 5C:
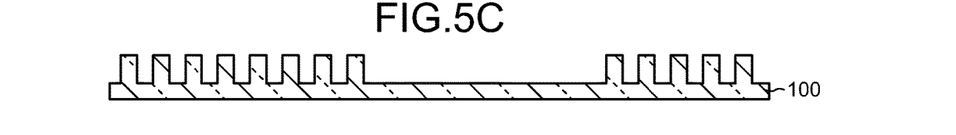

FIGS. 4A to 4C and FIGS. 5A to 5C are cross-sectional views schematically illustrating an example of a pattern forming method according to an embodiment. FIGS. 4A to 4C are cross-sectional views taken along line A-A in FIG. 1A to schematically illustrate the example of the pattern forming method, while FIGS. 5A to 5C are cross-sectional views taken along line B-B in FIG. 1B to schematically illustrate the example of the pattern forming method. FIGS. 4A and 5A both illustrate the state where the template 10 is released from the substrate 100. As illustrated in these figures, the height of a dummy pattern 141 formed in a concave pattern 132 having the width equal to 100 nm or wider in the resist pattern 110A is shorter than another concave-convex pattern such as a line-and-space pattern 120. Moreover, the height (depth) of a dummy pattern 152 formed in a convex pattern 131 having the width equal to 100 nm or wider in the resist pattern 110A is smaller than the height of the convex pattern 131 on which the dummy pattern 152 is formed.

Next, as illustrated in FIGS. 4B and 5B, anisotropic etching such as an RIE (Reactive Ion Etching) method is employed to use the resist pattern 110A as a mask and process the substrate 100. FIGS. 4B and 5B illustrate the process in progress where a portion corresponding to RLT (Residual Layer Thickness) of the resist is removed. The dummy patterns 141 and 152 have disappeared by this time.

The anisotropic etching is further performed from the aforementioned state to process the substrate 100 or the film to be processed formed above the substrate 100, as illustrated in FIGS. 4C and 5C. The substrate 100 having a desired processed pattern can be obtained as a result. Note that a portion corresponding to the dummy patterns 141 and 152 is not formed on the substrate 100 or the film to be processed since the dummy patterns 141 and 152 have disappeared from the resist pattern 110A. As a result, the dummy patterns 141 and 152 do not affect the device fabricated on the substrate 100.

A method of manufacturing such template will now be described. FIGS. 6A to 6D, 7A to 7D, and 8A to 8D are diagrams schematically illustrating an example of steps performed in the method of manufacturing a template according to an embodiment. FIGS. 6A to 6D are bottom views schematically illustrating the example of the steps performed in the method of manufacturing a template, FIGS. 7A to 7D are cross-sectional views taken along line C-C in FIGS. 6A to 6D to schematically illustrate the example of the method of manufacturing a template, and FIGS. 8A to 8D are cross-sectional views taken along line D-D in FIGS. 6A to 6D to schematically illustrate the example of the method of manufacturing a template.

Figure 6A:
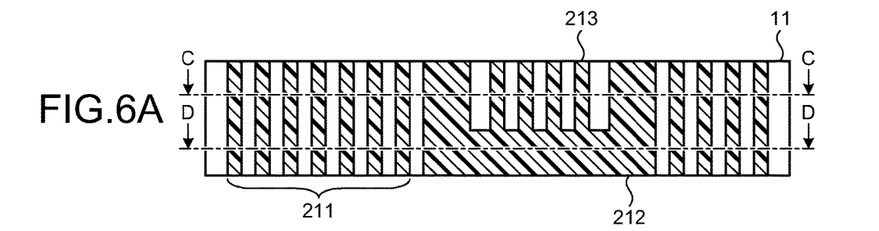
FIGS. 6A to 6D are bottom views schematically illustrating an example of steps performed in a method of manufacturing a template.
Figure 7A:
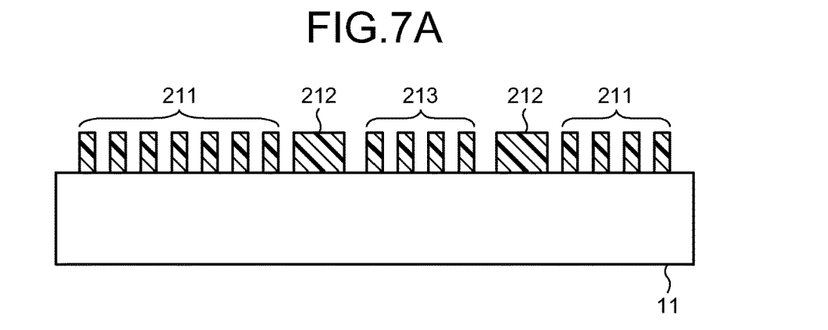
FIGS. 7A to 7D are cross-sectional views taken along line C-C in FIGS. 6A to 6D to schematically illustrate an example of the method of manufacturing a template.
Figure 8A:
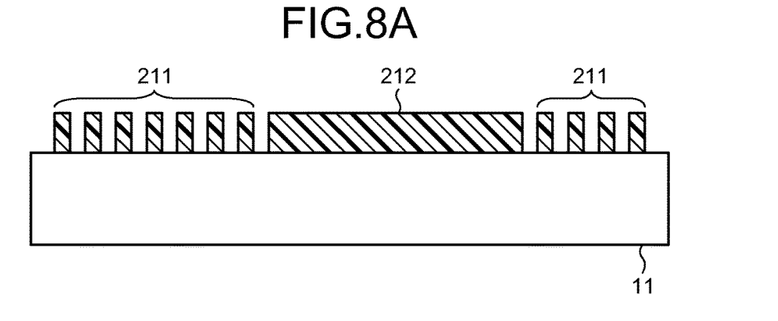
FIGS. 8A to 8D are cross-sectional views taken along line D-D in FIGS. 6A to 6D to schematically illustrate an example of the method of manufacturing a template.

First, as illustrated in FIGS. 6A, 7A, and 8A, the resist is applied all over one surface of the plate-like template substrate 11 made of glass, silicon, or resin. Electron beam lithography is then employed to perform exposure, followed by development to form a first resist pattern. The first resist pattern includes a pattern 211 used to form a line-and-space pattern and a pattern 212 used to form a peripheral pattern. Moreover, a dummy line-and-space pattern 213 is formed in a pattern having the width of a concave part (distance between patterns) wider than 100 nm, in the pattern 212 used to form the peripheral pattern. Note that the first resist pattern is hatched in the top view illustrated in FIG. 6A in order to facilitate understanding.

Figure 6B:
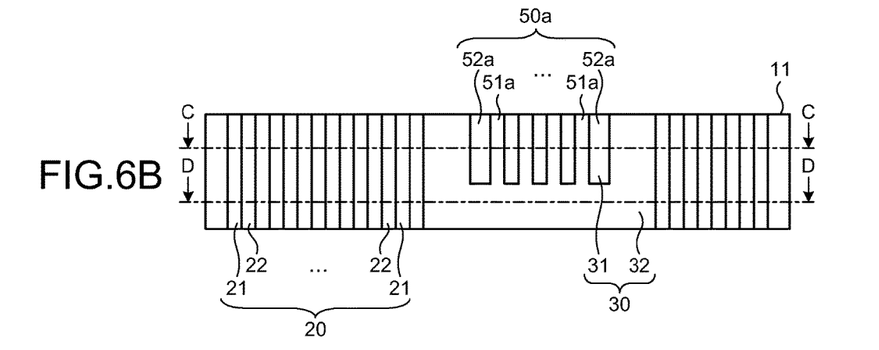
Figure 7B:
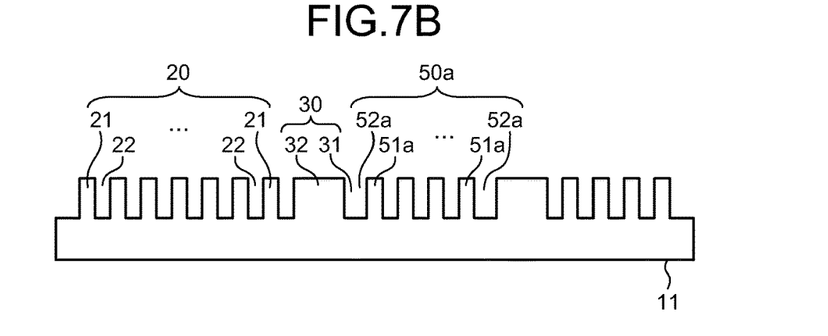
Figure 8B:
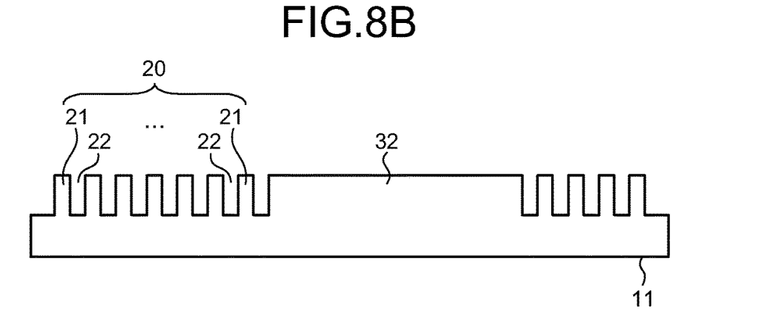

Next, as illustrated in FIGS. 6B, 7B, and 8B, the first resist pattern is used as a mask to etch the template substrate 11 down to a predetermined depth by using the anisotropic etching such as the RIE method. The template substrate 11 is etched to the depth such that the aspect ratio of the line-and-space pattern 20 equals 2 or higher, for example. As a result, there is formed a first template pattern formed by transferring the first resist pattern to the template substrate 11.

The line-and-space pattern 20 in which the line pattern 21 and the space pattern 22 are arranged alternately is formed in the area corresponding to the pattern 211. The peripheral pattern 30 is formed in the area corresponding to the pattern 212. A dummy line-and-space pattern 50a in which a line pattern 51a and a space pattern 52a are arranged alternately is formed in the area corresponding to the pattern 213. The line-and-space pattern 20, the peripheral pattern 30, and the dummy line-and-space pattern 50a all have the same pattern height.

Figure 6C:
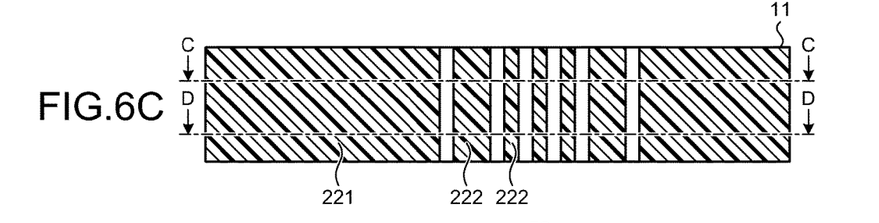
Figure 7C:
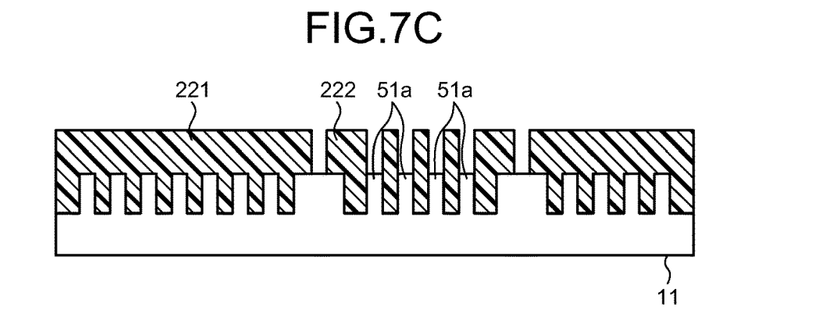
Figure 8C:
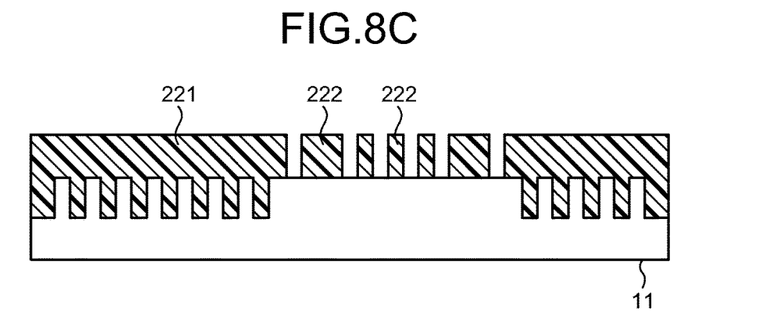

Subsequently, as illustrated in FIGS. 6C, 7C, and 8C, the resist is applied all over a surface, on which the first template pattern is formed, of the template substrate 11. The electron beam lithography is then employed to perform exposure, followed by development to form a second resist pattern. Specifically, there is provided a pattern 221 that covers the area in which the line-and-space pattern 20 is formed. A pattern 222 is further formed such that the area in which the line pattern 51a is formed is opened in the concave pattern 31 of the peripheral pattern 30 and that a dummy line-and-space pattern is formed on the convex pattern 32, having the width of the convex portion equal to 100 nm or wider, in the peripheral pattern 30. Note that the second resist pattern is hatched in the top view illustrated in FIG. 6C in order to facilitate understanding.

Figure 6D:
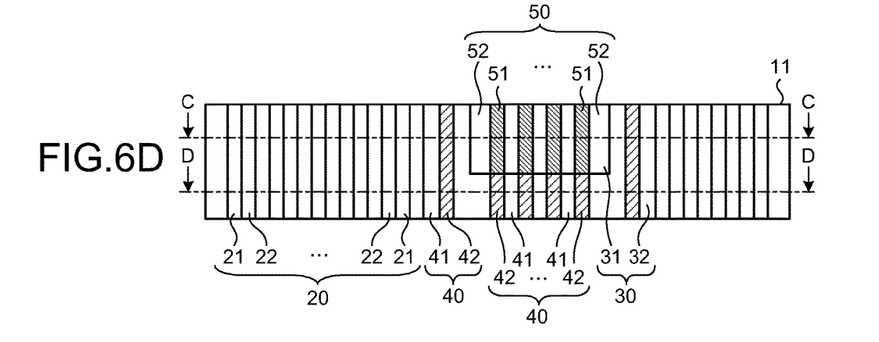
Figure 7D:
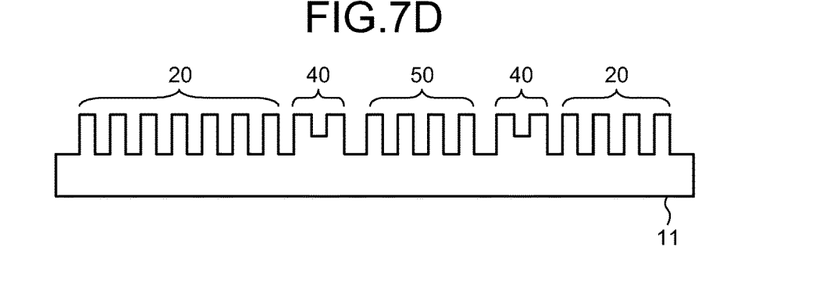
Figure 8D:
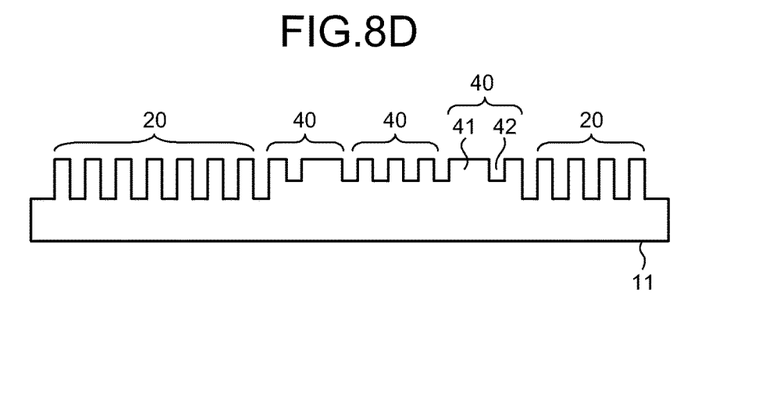

Subsequently, as illustrated in FIGS. 6D, 7D, and 8D, the second resist pattern is used as a mask to etch the template substrate 11 by employing the anisotropic etching such as the RIE method. At this time, the etching is performed under the condition that the depth of the area not masked with the second resist pattern is made shallower than the depth of the first template pattern. The template substrate 11 is etched to the depth such that the aspect ratio of the area not covered with the second resist pattern equals 1 or lower, for example. Accordingly, the top surface of the dummy line pattern 51a formed in the concave pattern 31 of the peripheral pattern 30 as illustrated in FIGS. 6B and 7B retreats from the top surface of the convex pattern 32. Moreover, the line-and-space dummy pattern 40 in which the space pattern 42 shallower than the convex pattern 32 is arranged is formed on the convex pattern 32 of the peripheral pattern 30. The template 10 illustrated in FIGS. 1A to 1C is then formed by removing the second resist pattern.

In the present embodiment where there exists the concave pattern 31 having the width wider than 100 nm in the template 10 used in the nanoimprint lithography, the dummy pattern 50 including the space pattern 52 which is shorter than the concave pattern 31 and has the width equal to 100 nm or less is formed on the concave pattern 31. This allows the space pattern 52 of the dummy pattern 50 formed in the concave pattern 31 having the width wider than 100 nm to be quickly filled with the resist 110 by the capillary phenomenon at the time of the imprint processing.

Figure 9:
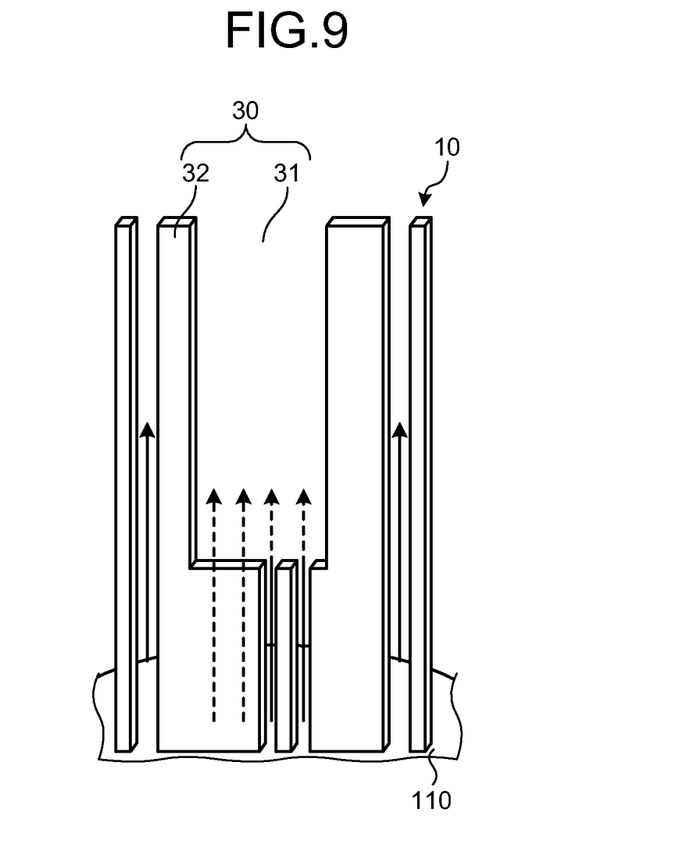
FIG. 9 is a diagram schematically illustrating a state when a typical template is brought into contact with a substrate through a resist.

FIG. 9 is a diagram schematically illustrating a state where a typical template is brought into contact with a substrate through a resist. When there exists a concave pattern 31 having the width wider than 100 nm in a template 10, as illustrated in FIG. 9, it takes a considerable amount of time for the concave pattern 31 to be filled with a resist 110 since the capillary phenomenon does not work at the time of the imprint processing. Compared to such case where the typical template is used, the present embodiment can cut the time it takes for the concave pattern 31 having the width wider than 100 nm to be filled with the resist 110. This as a result brings the effect of speeding up the imprint processing.

Moreover, the height of the dummy patterns 40 and 50 is made shorter than the height of the concave-convex pattern used to form the pattern on the substrate 100 (to be processed) so that, even when the dummy patterns 40 and 50 are transferred to the resist pattern, the transferred dummy pattern disappears while the pattern is processed onto the substrate 100 (to be processed). In other words, the resist pattern created by transferring the dummy patterns 40 and 50 is not transferred to a device pattern that is eventually formed above the substrate 100. This as a result brings the effect that the dummy patterns 40 and 50 do not affect the device pattern formed above the substrate 100.

Furthermore, there has been a case in the related art where the resist 110 is dropped to a position corresponding to the position of the large peripheral pattern 30 in order for the large peripheral pattern 30 to be filled with the resist 110 more quickly. Such arrangement of the resist 110 need not be considered in the present embodiment. As a result, the arrangement of the resist 110 can be fixed regardless of the shape of the pattern formed in the template 10. In other words, one need not perform an operation to modify the arrangement of the resist 110 for each shape of the pattern formed in the template 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising:
a first pattern including a plurality of first concave portions, each of the first concave portions having a width equal to 100 nm or less;
a second pattern including a second concave portion and a first convex portion, the first convex portion surrounding the second concave portion, and the second concave portion having a width wider than 100 nm; and
a dummy pattern running through the first convex portion and reaching the second concave portion, the dummy pattern including a third concave portion and second convex portions, the second convex portions being arranged on both sides of the third concave portion, a depth of the third concave portion being shallower than a depth of the second concave portion, and a width of the third concave portion being equal to 100 nm or less.

2. The template according to claim 1, wherein:
the first concave portions are arranged at an interval of 100 nm or less therebetween in a direction intersecting a direction in which the first concave portions extend, and
the third concave portion has a width identical to that of the first concave portions.

3. The template according to claim 2, wherein:
an aspect ratio of the first concave portions equals 2 or higher, the aspect ratio of the first concave portions being a ratio of a pattern depth to a pattern width of the first concave portions, and
an aspect ratio of the third concave portion equals 1 or lower, the aspect ratio of the third concave portion being a ratio of a pattern depth to a pattern width of the third concave portion.

4. The template according to claim 2, wherein an aspect ratio of the first concave portions differs from an aspect ratio of the third concave portion by 1 or more, the aspect ratio of the first concave portions being a ratio of a pattern depth to a pattern width of the first concave portions, the aspect ratio of the third concave portion being a ratio of a pattern depth to a pattern width of the third concave portion.

5. The template according to claim 1, wherein:
the template is configured to be brought into contact with a resist on an object to be processed, such that the first pattern, the second pattern, and the dummy pattern are transferred to the resist, to process the object using the resist to which the first pattern, the second pattern, and the dummy pattern have been transferred, and
the depth of the third concave portion is set such that the dummy pattern is prevented from being transferred to the object to be processed.

6. The template according to claim 1, wherein another dummy pattern is provided at a bottom of the second concave portion of the second pattern.

7. The template according to claim 6, wherein said another dummy pattern, which is provided at the bottom of the second concave portion of the second pattern, includes a third convex portion.

8. The template according to claim 7, wherein:
said another dummy pattern, which is provided at the bottom of the second concave portion of the second pattern, includes fourth concave portions arranged on both sides of the third convex portion;
the third convex portion is connected to the third concave portion; and
the third convex portion and the third concave portion are aligned in a straight line in a plan view of the template.

9. The template according to claim 1, wherein another dummy pattern is provided between the first pattern and the second pattern.

10. The template according to claim 1, wherein the dummy pattern is a line-and-space pattern.

* * * * *